(12) United States Patent
Li et al.

(10) Patent No.: US 8,581,766 B1
(45) Date of Patent: Nov. 12, 2013

(54) DAC WITH NOVEL SWITCH REGULATION

(75) Inventors: Yuanfang Li, Irvine, CA (US); David Castaneda, Morgan Hill, CA (US); Ling Liu, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 89 days.

(21) Appl. No.: 13/351,570

(22) Filed: Jan. 17, 2012

Related U.S. Application Data

(60) Provisional application No. 61/547,870, filed on Oct. 17, 2011.

(51) Int. Cl.
*H03M 1/78* (2006.01)

(52) U.S. Cl.
USPC .......................................... 341/154; 341/145

(58) Field of Classification Search
USPC .................................................. 341/145, 154
See application file for complete search history.

(56) References Cited

U.S. PATENT DOCUMENTS 6,380,877 B2 * 4/2002 Castaneda et al. ............ 341/154
6,573,811 B2 * 6/2003 Martin .......................... 333/172

* cited by examiner

*Primary Examiner* — Khai M Nguyen

(57) ABSTRACT

A system includes an NL bit digital to analog converter (DAC) ladder module having NL ladder resistors connected in parallel, NL series resistors connected in series between the NL ladder resistors, and a plurality of switches. NL is an integer greater than one. Adjacent pairs of the plurality of switches are connected in series with respective ones of the ladder resistors. On resistances of each of the plurality of switches are approximately equal. A switch control module provides a plurality of switch control signals to respective ones of the plurality of switches.

24 Claims, 5 Drawing Sheets

DAC WITH NOVEL SWITCH REGULATION

CROSS-REFERENCE TO RELATED APPLICATIONS

This application claims the benefit of U.S. Provisional Application No. 61/547,870, filed on Oct. 17, 2011. The entire disclosure of the above application is incorporated herein by reference.

FIELD

The present disclosure relates to digital-to-analog converters, and more particularly to switch regulation of digital-to-analog converters.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital-to-analog converters (DACs) receive a digital input signal and convert the digital input signal into an analog output signal. The digital input signal has a range of digital codes that are converted into a continuous range of analog signal levels of the analog output signal. Accordingly, DACs are typically used to convert data between applications operating in digital and analog domains. For example only, applications of DACs include, but are not limited to, video display drivers, audio systems, digital signal processing, function generators, digital attenuators, data storage and transmission, precision instruments, and data acquisition systems.

A variety of types of DACs are available based upon desired functionality. For example only, DACs may have varying predetermined resolutions of the digital input signal, receive different encoded digital input signals, have different ranges of analog output signals using a fixed reference or a multiplied reference, and provide different types of analog output signals. Various DAC performance factors include, but are not limited to, settling time, full scale transition time, accuracy or linearity, and resolution.

A number of bits (i.e. a bit width) of the digital input signal defines the resolution, a number of output (quantization) levels, and a total number of digital codes that are acceptable for the DAC. For example, if the digital input signal is m-bits wide, the DAC has $2^m$ output levels.

Referring now to FIG. 1, an example DAC 10 includes a ladder module 12 having m ladder bits and a switch control module 14. For example only, the ladder module 12 is an R-βR ladder. When β=2, the R-βR ladder may be referred to as an R-2R, or binary radix, ladder, corresponding to a binary radix DAC. In a binary radix DAC, the ratio of a DAC element to a next (lower) DAC element is 2. When β is greater than or less than 2, the ladder may be referred to as a non-binary ladder. For example, in a sub-binary radix (i.e. sub-radix$_2$) ladder (corresponding to a sub-binary radix DAC), the ratio of a DAC element to a next lower DAC element is a constant greater than 2 (i.e. sub-binary). For example only, the ratio may be approximately 2.5, which would set the radix of the DAC to a sub-binary value approximately equal to 1.85.

The ladder module 12 receives analog reference signals 16 and 18. For example only, the analog reference signal 16 may be ground and the analog reference signal 18 may be a positive reference voltage. The switch control module 14 receives bits $b_0, b_1, \ldots, b_{m-1}$ of an m-bit binary digital input signal 20 and controls switches (not shown) of the ladder module 12 based on the m bits of the digital input signal 20. The ladder module 12 generates an analog output signal 22 based on the digital input signal 20 (i.e. the controlled switches of the ladder module 12) and the analog reference signals 16 and 18. Accordingly, the analog output signal 22 corresponds to the digital-to-analog conversion of the digital input signal 20.

Referring now to FIG. 2, the ladder module 12 of the DAC 10 is shown to include resistors $RL_0 \ldots RL_{m-1}$, referred to collectively as $RL_i$, and resistors $RDL_0 \ldots RDL_{m-1}$, referred to collectively as resistors $RDL_i$. Each of the resistors $RL_i$ has a value R and each of the resistors $RDL_i$ has a value βR. In other words, β corresponds to a ratio of an RDL resistor value to an RL resistor value. A termination resistor RT has a value of γR. The values of β and γ satisfy the equation $\gamma 2 = \beta + \gamma$. The analog reference signals 16 and 18 are selectively provided to the resistors RT and $RDL_i$ via switches 30.

Referring now to FIG. 3, the switch control module 14 includes a switch regulator module 40 and a switch driver module 42. The switch regulator module 40 receives the analog reference signals 16 and 18 and generates a gate driver signal 44 having a voltage $V_{GN}$. The switch driver module 42 receives the gate driver signal 44, the analog reference signal 18, and the m-bit binary digital input signal 20. The switch driver module 42 generates a plurality of switch control signals 46 to control the switches 30 based on the gate driver signal 44, the analog reference signal 18, and the m-bit binary digital input signal 20. For example only, the switch driver module 42 may implement a cascaded inverter that selectively outputs the gate driver signal 44 and the analog reference signal 18 according to the m-bit binary digital input signal 20. For example, the gate driver signal 44 may be used to control the switches 30 that include N-type transistors. Conversely, the analog reference signal 18 may be used to control the switches 30 that include P-type transistors.

Bits of the ladder module 12 are set or cleared based on the switch control signals 46 input to the switches 30. For example, a bit may correspond to an adjacent pair of the switches 30 including an N-type transistor and a P-type transistor. The bit may be set when one of the switches 30, connected to the analog reference signal 18, is closed and the other of the switches 30, connected to the analog reference signal 16, is open. Conversely, the bit may be cleared when the one of the switches 30 connected to the analog reference signal 16 is open and the other of the switches 30 connected to the analog reference signal 16 is closed.

Referring now to FIG. 4, the switch regulator module 40 includes first and second switches 50 and 52 (e.g., first and second transistors, respectively), an operational amplifier 54, and resistors 56, 58, 60, and 62. Each of the resistors 56 and 58 has a value Rx and each of the resistors 60 and 62 has a value Ry. The switch regulator module 40 regulates the gate driver signal 44 using a negative feedback loop such that the on resistances of any given pair of the switches 30 (e.g., the N-type transistor and the P-type transistor corresponding to any bit) are equal. In this manner, the regulated gate driver signal 44 is used to drive the gates of all of the switches 30 corresponding to N-type transistors, and the analog voltage reference 18 drives the gates of the switches 30 corresponding to P-type transistors. Conversely, in other implementations the switch regulator module 40 could instead generate the gate driver signal 44 for the switches 30 corresponding to P-type transistors, and the analog voltage reference 18 could be used to drive the gates of the switches 30 corresponding to N-type transistors. In other implementations, only N-type transistors or only P-type transistors may be used.

As shown in FIG. 2, aspect ratios of the sizes of the switches 30 are scaled up from a least significant bit (LSB) to a most significant bit (MSB). In other words, the aspect ratios of the switches 30 are scaled up from right to left. Accordingly, on resistances of the switches 30 are scaled down from right to left. As the number of bits in the ladder module 12 increases, the size of each additional MSB switch increases exponentially, resulting in increased die size and increased sensitivity to layout parasitic resistance and/or capacitance.

Typically, on resistances of the switches 30 are minimized to reduce linearity degradation caused by on resistance mismatch and drift. Further, the switches 30 corresponding to the LSBs of the ladder module 12 are kept small enough such that the switches 30 are not forced into a saturation region. Accordingly, the switches 30 are selected to minimize the on resistances of the LSB switches, which corresponds to increased die size, to prevent the switches 30 from entering the saturation region and causing linearity degradation. The limitations on the on resistance as well as the scaling of the switches 30 can result in prohibitively large MSB switches.

SUMMARY

A system includes an NL bit digital to analog converter (DAC) ladder module having NL ladder resistors connected in parallel, NL series resistors connected in series between the NL ladder resistors, and a plurality of switches. NL is an integer greater than one. Adjacent pairs of the plurality of switches are connected in series with respective ones of the ladder resistors. On resistances of each of the plurality of switches are approximately equal. A switch control module provides a plurality of switch control signals to respective ones of the plurality of switches.

A method for regulating switches in an NL bit digital to analog converter includes providing NL ladder resistors connected in parallel, connecting NL series resistors in series between the NL ladder resistors, connecting adjacent pairs of a plurality of switches in series with respective ones of the ladder resistors, wherein NL is an integer greater than one, and wherein on resistances of each of the plurality of switches are approximately equal, and providing a plurality of switch control signals to respective ones of the plurality of switches.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

In the DAC of the present disclosure, single or dual switch regulator modules regulate switches corresponding to the of a ladder module. The on resistances $R_{ON}$ of each of the switches are matched to resistors in the switch regulator modules having a value $R_{ON}$. Further, resistors between bits of the ladder module are selected based on the on resistance $R_{ON}$. Accordingly, the switches have a uniform size (i.e., a uniform on resistance $R_{ON}$) across all bits of the ladder module.

Figure 2:
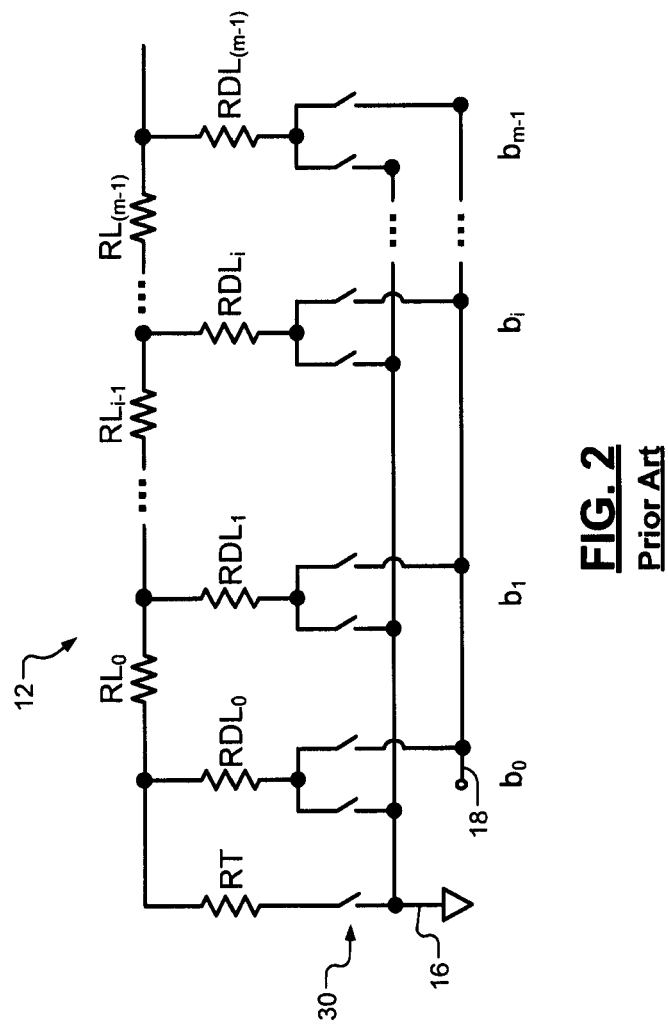
FIG. 2 illustrates a ladder module of a digital to analog converter according to the prior art.
Figure 1:
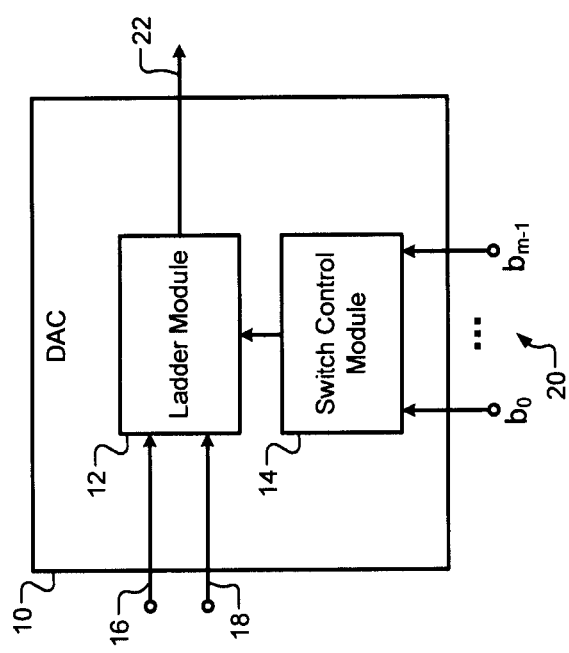
FIG. 1 is a functional block diagram of a digital to analog converter according to the prior art.
Figure 4:
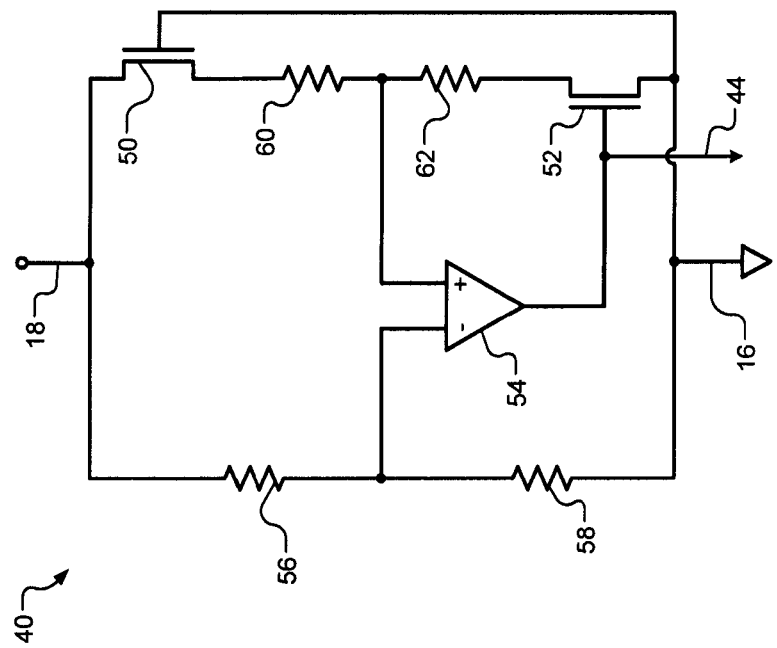
FIG. 4 illustrates a switch regulator module according to the prior art.
Figure 3:
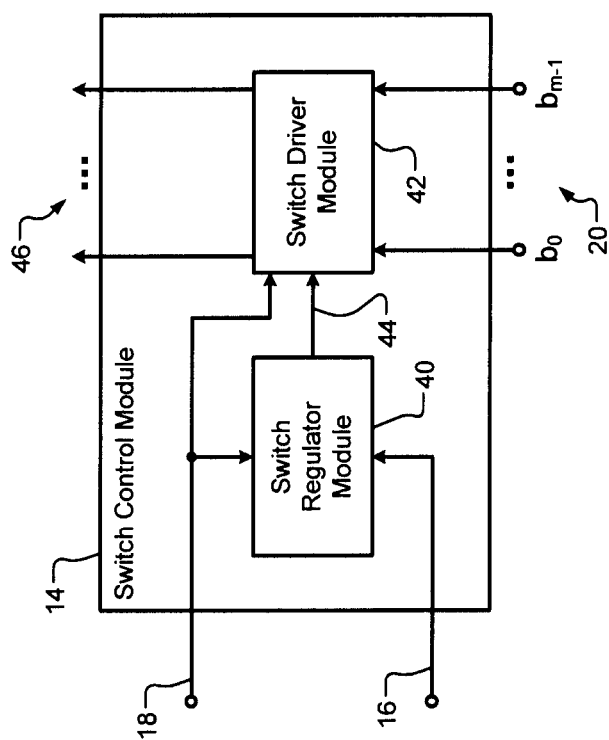
FIG. 3 is a functional block diagram of a switch control module according to the prior art.
Figure 5:
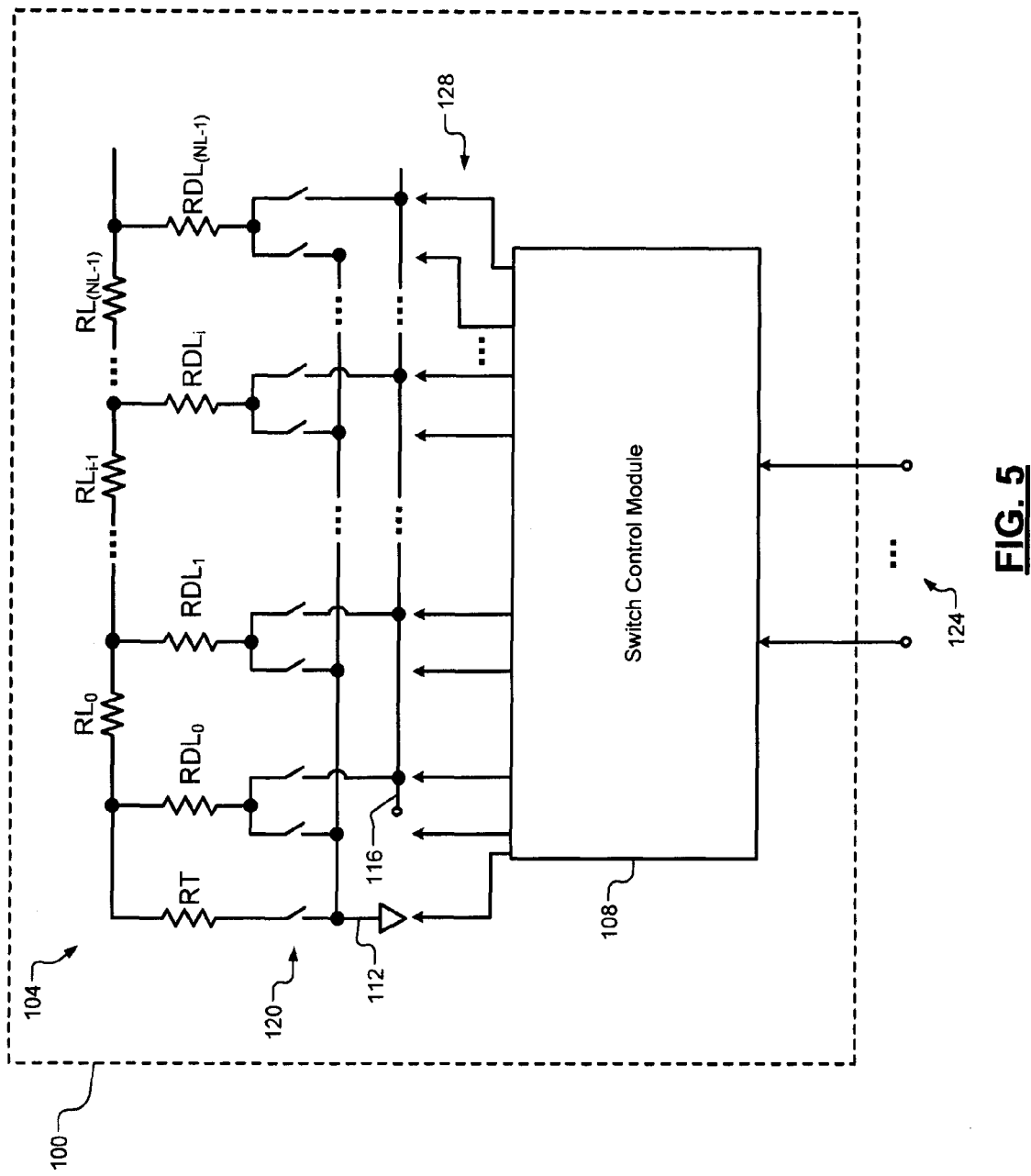
FIG. 5 illustrates a digital to analog converter according to the present disclosure.

Referring now to FIG. 5, a DAC 100 includes a ladder module 104 and a switch control module 108. The ladder module 104 includes NL series resistors $RL_0 \ldots RL_{NL-1}$, referred to collectively as $RL_i$, and NL ladder resistors $RDL_0 \ldots RDL_{NL-1}$, referred to collectively as resistors $RDL_i$. Each of the resistors $RL_i$ has a value $R+R_{ON}/\beta$ (where R corresponds to a resistance of an R-βR DAC) and each of the resistors $RDL_i$ has a value βR. A termination resistor RT has a value of γR. The values of β and γ satisfy the equation $\gamma 2 = \beta + \gamma$. Analog reference signals 112 and 116 are selectively provided to the resistors RT and $RDL_i$ via switches 120. The switch control module 108 generates a plurality of switch control signals 128 to control the switches 120 according to an NL-bit binary digital input signal 124. The DAC 100 may be a binary radix DAC or a non-binary radix DAC. For example, although the DAC 100 is shown to include only the ladder module 104, the DAC 100 may be a sub-binary radix DAC that implements MSB segmentation and includes an LSB ladder module and an MSB segment module. An example sub-binary radix DAC that implements MSB segmentation is described in U.S. patent application Ser. No. 13/023,093, filed on Feb. 8, 2011, which is hereby incorporated herein by reference in its entirety.

The switches 120 are uniformly sized and, accordingly, each of the switches 120 has an on resistance $R_{ON}$. As such, the values of each of the resistors $RL_i$, (i.e., $R+R_{ON}/\beta$) correspond to the on resistance $R_{ON}$ of the switches 120. In other words, each of the switches 120 has an on resistance approximately equal to a value $R_{ON}$ instead of being scaled by a factor related to the radix of the DAC 100. For example only, each of the switches 120 may have on resistances within a range of 1% of the value $R_{ON}$. However, it can be appreciated that the switches 120 may have on resistances within other ranges of $R_{ON}$ without departing from the principles of the present disclosure. For example, the switches 120 may have on resistances within a range of 10% or 20% of $R_{ON}$. Further, a first plurality of the switches 120 may have the same first on resistance and a second plurality of the switches 120 may have the same second on resistance. For example only, the switches 120 corresponding to N-type transistors may all have a first on resistance while the switches 120 corresponding to P-type transistors may all have a second on resistance, wherein the first on resistance and the second on resistance are different.

Figure 6:
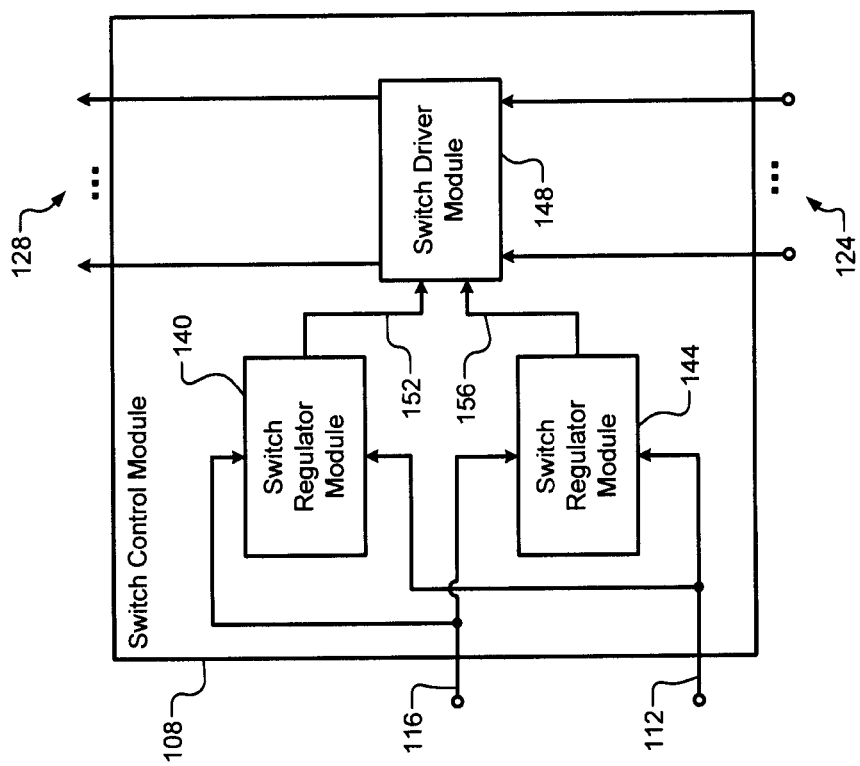
FIG. 6 is a functional block diagram of a switch control module according to the present disclosure.

Referring now to FIG. 6, the switch control module 108 includes first and second switch regulator modules 140 and 144 and a switch driver module 148. The switch regulator module 140 receives the analog reference signals 112 and 116 and generates a gate driver signal 152 having a voltage $V_{GN}$. The switch regulator module 144 receives the analog reference signals 112 and 116 and generates a gate driver signal 156 having a voltage $V_{GP}$. In other words, the switch regulator module 140 generates the gate driver signal 152 to regulate the switches 120 corresponding to N-type transistors and the switch regulator module 144 generates the gate driver signal 156 to regulate the switches 120 corresponding to P-type transistors. However, in implementations of the DAC 100 where the switches 120 include only N-type transistors or only P-type transistors, then only one of the corresponding switch regulator modules 140 and 144 is included.

The switch driver module 148 receives the gate driver signals 152 and 156 and the digital input signal 124. The switch driver module 148 generates the plurality of switch control signals 128 to control the switches 120 based on the gate driver signals 152 and 156 and the digital input signal 124. For example only, the switch driver module 148 may implement a cascaded inverter that selectively outputs the gate driver signals 152 and 156 according to the digital input signal 124. For example, the gate driver signal 152 may be used to control the switches 120 that include N-type transistors. Conversely, the gate driver signal 156 may be used to control the switches 120 that include P-type transistors.

Figure 7:
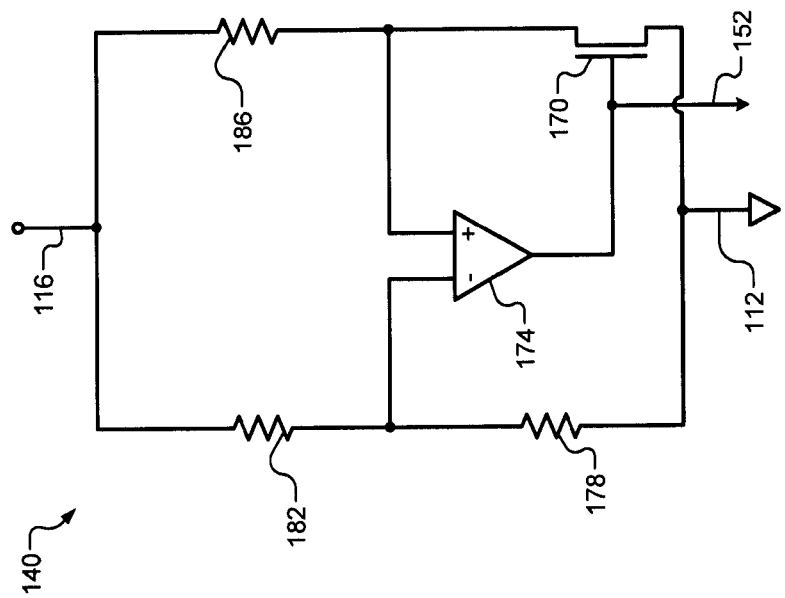
FIG. 7 illustrates a first switch regulator module according to the present disclosure.

Referring now to FIG. 7, the switch regulator module 140 includes a switch 170 (e.g., a transistor), an operational amplifier 174, and resistors 178, 182, and 186. Each of the resistors 182 and 186 has a value Rz and the resistor 178 has a value $R_{ON}$. In other words, the resistor 178 has a value $R_{ON}$ that is matched to the on resistance $R_{ON}$ of the switches 120. Accordingly, the switch regulator module 140 regulates the gate driver signal 152 (i.e., $V_{GN}$) using a negative feedback loop including the resistor 178 such that the on resistance $R_{ON}$ of the switches 120 including N-type transistors matches the value $R_{ON}$ of the resistor 178. In this manner, the regulated gate driver signal 152 is used to drive the gates of all of the switches 120 corresponding to N-type transistors.

Figure 8:
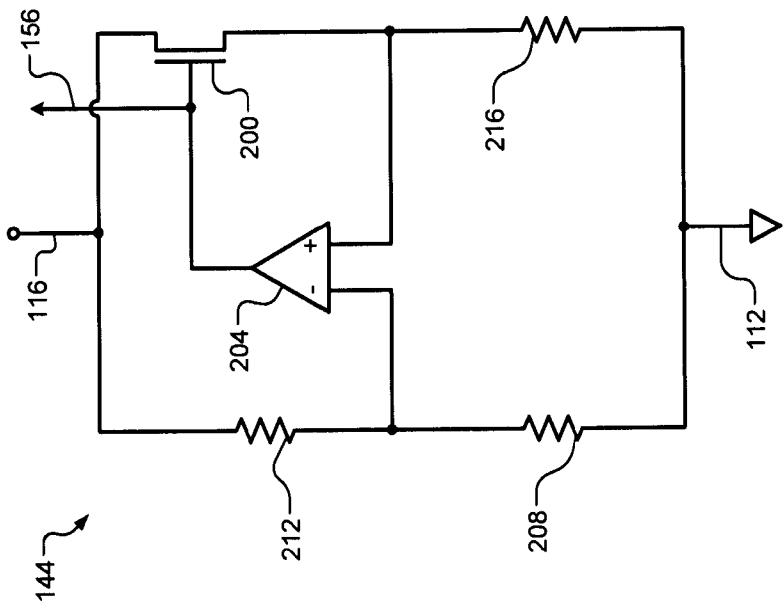
FIG. 8 illustrates a second switch regulator module according to the present disclosure.

Referring now to FIG. 8, the switch regulator module 144 includes a switch 200 (e.g., a transistor), an operational amplifier 204, and resistors 208, 212, and 216. Each of the resistors 208 and 216 have a value Rz and the resistor 212 has a value $R_{ON}$. In other words, the resistor 212 has a value $R_{ON}$ that is matched to the on resistance $R_{ON}$ of the switches 120. Accordingly, the switch regulator module 144 regulates the gate driver signal 156 (e.g., $V_{GP}$) using a negative feedback loop including the resistor 212 such that the on resistance $R_{ON}$ of the switches 120 including P-type transistors matches the value $R_{ON}$ of the resistor 212. In this manner, the regulated gate driver signal 156 is used to drive the gates of all of the switches 120 corresponding to P-type transistors.

Accordingly, the on resistances $R_{ON}$ of both the switches 120 corresponding to N-type transistors and the switches 120 corresponding to P-type transistors are regulated to match the resistors 178 and 212, respectively, and the values of the resistors $RL_i$ are adjusted according to $R_{ON}$. Consequently, the size of the switches 120 is only dependent upon drift requirements and the on resistance matching of the switches 120, minimizing die area corresponding to the switches 120. Further, the on resistances of the switches 120 are not dependent upon reference or supply voltages (e.g., the reference signals 112 and 116).

Further, when the resistors 178 and 212 are thin film resistors, the on resistances $R_{ON}$ of the switches 120 are as temperature stable as the resistors 178 and 212. For example, the temperature coefficient of the switches 120 may be regulated to match the temperature coefficient of the resistors 178 and 212, and the feedback loop in the switch regulator modules 140 and 144 causes the on resistances $R_{ON}$ to track the resistors 178 and 212. Accordingly, an output impedance of the DAC 100 is also temperature independent.

Figure 9:
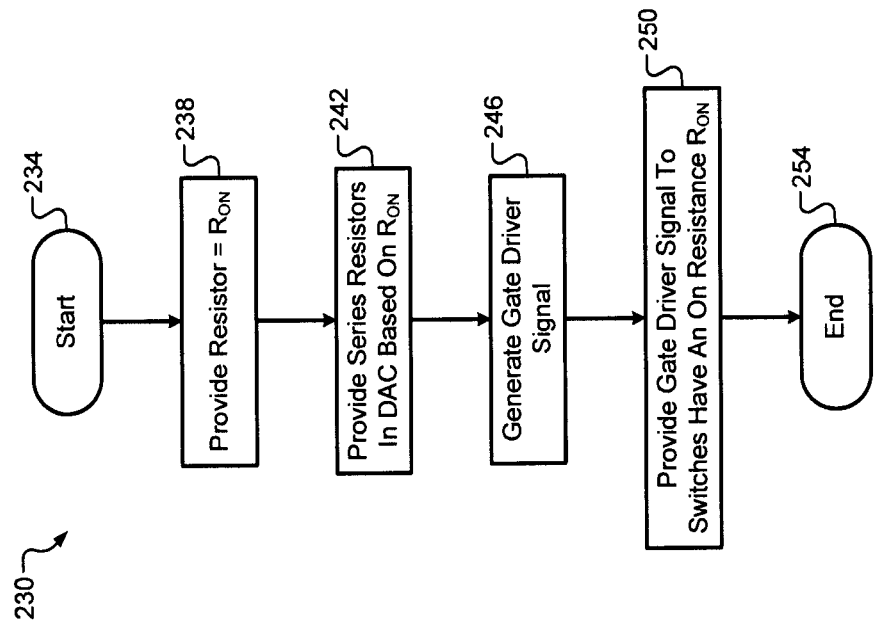
FIG. 9 is a flow diagram of a digital to analog converter switch regulation method according to the present disclosure.

Referring now to FIG. 9, a DAC switch regulation method 230 begins at 234. At 238, the method 230 provides a resistor having an on resistance $R_{ON}$ in at least one switch regulator module. At 242, the method 230 provides series resistors having a value based on the on resistance $R_{ON}$ in a ladder module of a DAC. At 246, the method 230 provides a gate driver signal using a negative feedback loop that includes the resistor. At 250, the method 230 provides the gate driver signal to control switches of the DAC having an on resistance $R_{ON}$. The method 230 ends at 254.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:
1. A system comprising:
an NL bit digital to analog converter (DAC) ladder module having NL ladder resistors connected in parallel, NL series resistors connected in series between the NL ladder resistors, and a plurality of switches, wherein NL is an integer greater than one, wherein adjacent pairs of the plurality of switches are connected in series with respec- tive ones of the ladder resistors, and wherein on resistances of each of the plurality of switches are approximately equal; and a switch control module that provides a plurality of switch control signals to respective ones of the plurality of switches, wherein each of the NL series resistors has a value based on the on resistances of the plurality of switches, and wherein the value is $R+R_{ON}/\beta$, wherein R is a DAC resistance, a ratio of a DAC element to $R\beta$ determines a DAC radix, and $R_{ON}$ is the on resistance of each of the plurality of switches.

2. A system comprising:

an NL bit digital to analog converter (DAC) ladder module having NL ladder resistors connected in parallel, NL series resistors connected in series between the NL ladder resistors, and a plurality of switches, wherein NL is an integer greater than one, wherein adjacent pairs of the plurality of switches are connected in series with respective ones of the ladder resistors, and wherein on resistances of each of the plurality of switches are approximately equal; and a switch control module that provides a plurality of switch control signals to respective ones of the plurality of switches, wherein the switch control module includes a first switch regulator module that generates a first gate driver signal, and wherein at least a first group of the plurality of switch control signals are based on the first gate driver signal.

3. The system of claim 2 wherein the first switch regulator module includes a first resistor having a value $R_{ON}$, and wherein the first switch regulator module generates the first gate driver signal based on the first resistor.

4. The system of claim 3 wherein the first switch regulator module includes a first negative feedback loop including a first switch, a first operational amplifier, and the first resistor, and wherein the first switch regulator module generates the first gate driver signal using the first negative feedback loop.

5. The system of claim 2 wherein the first group of the plurality of switch control signals are provided to a first group of the plurality of switches, and wherein the first group of the plurality of switches includes N-type transistors.

6. The system of claim 5 wherein the switch control module includes a second switch regulator module that generates a second gate driver signal, wherein at least a second group of the plurality of switch control signals are based on the second gate driver signal, wherein the second switch regulator module includes a second resistor having a value $R_{ON}$, and wherein the second switch regulator module generates the second gate driver signal based on the second resistor.

7. The system of claim 6 wherein the second switch regulator module includes a second negative feedback loop including a second switch, a second operational amplifier, and the second resistor, and wherein the second switch regulator module generates the second gate driver signal using the second negative feedback loop.

8. The system of claim 6 wherein the second group of the plurality of switch control signals are provided to a second group of the plurality of switches, and wherein the second group of the plurality of switches includes P-type transistors.

9. The system of claim 2 wherein the switch control module includes a second switch regulator module that generates a second gate driver signal, and wherein at least a second group of the plurality of switch control signals are based on the second gate driver signal.

10. The system of claim 2 wherein each of the NL series resistors has a value based on the on resistances of the plurality of switches, and wherein the value is $R+R_{ON}/\beta$, wherein R is a DAC resistance, a ratio of a DAC element to $R\beta$ determines a DAC radix, and $R_{ON}$ is the on resistance of each of the plurality of switches.

11. A system comprising:

an NL bit digital to analog converter (DAC) ladder module having NL ladder resistors connected in parallel, NL series resistors connected in series between the NL ladder resistors, and a plurality of switches, wherein NL is an integer greater than one, wherein adjacent pairs of the plurality of switches are connected in series with respective ones of the ladder resistors, and wherein on resistances of each of the plurality of switches are approximately equal;

a switch control module that provides a plurality of switch control signals to respective ones of the plurality of switches; and an NS bit segment module having a plurality of segment resistors connected in parallel and a plurality of segment switches, wherein adjacent pairs of the plurality of segment switches are connected in series with respective ones of the segment resistors, and wherein on resistances of each of the plurality of segment switches are approximately equal to the on resistances of the plurality of switches.

12. The system of claim 11 wherein each of the NL series resistors has a value based on the on resistances of the plurality of switches, and wherein the value is $R+R_{ON}/\beta$, wherein R is a DAC resistance, a ratio of a DAC element to $R\beta$ determines a DAC radix, and $R_{ON}$ is the on resistance of each of the plurality of switches.

13. A method for regulating switches in an NL bit digital to analog converter, comprising:

providing NL ladder resistors connected in parallel;

connecting NL series resistors in series between the NL ladder resistors;

connecting adjacent pairs of a plurality of switches in series with respective ones of the ladder resistors, wherein NL is an integer greater than one, and wherein on resistances of each of the plurality of switches are approximately equal; and providing a plurality of switch control signals to respective ones of the plurality of switches, wherein each of the NL series resistors has a value based on the on resistances of the plurality of switches, and wherein the value is $R+R_{ON}/\beta$, wherein R is a DAC resistance, a ratio of a DAC element to $R\beta$ determines a DAC radix, and $R_{ON}$ is the on resistance of each of the plurality of switches.

14. A method for regulating switches in an NL bit digital to analog converter, comprising:

providing NL ladder resistors connected in parallel;

connecting NL series resistors in series between the NL ladder resistors;

connecting adjacent pairs of a plurality of switches in series with respective ones of the ladder resistors, wherein NL is an integer greater than one, and wherein on resistances of each of the plurality of switches are approximately equal;

providing a plurality of switch control signals to respective ones of the plurality of switches; and generating a first gate driver signal, and wherein at least a first group of the plurality of switch control signals are based on the first gate driver signal.

15. The method of claim 14 further comprising generating the first gate driver signal based on a first resistor having a value $R_{ON}$.

16. The method of claim 15 further comprising:
providing a first negative feedback loop including a first switch, a first operational amplifier, and the first resistor; and
generating the first gate driver signal using the first negative feedback loop.

17. The method of claim 14 further comprising providing the first group of the plurality of switch control signals to a first group of the plurality of switches, wherein the first group of the plurality of switches includes N-type transistors.

18. The method of claim 17 further comprising:
generating a second gate driver signal, wherein at least a second group of the plurality of switch control signals are based on the second gate driver signal; and
generating the second gate driver signal based on a second resistor having a value $R_{ON}$.

19. The method of claim 18 further comprising:
providing a second negative feedback loop including a second switch, a second operational amplifier, and the second resistor; and
generating the second gate driver signal using the second negative feedback loop.

20. The method of claim 18 further comprising providing the second group of the plurality of switch control signals to a second group of the plurality of switches, wherein the second group of the plurality of switches includes P-type transistors.

21. The method of claim 14 further comprising generating a second gate driver signal, wherein at least a second group of the plurality of switch control signals are based on the second gate driver signal.

22. The method of claim 14 wherein each of the NL series resistors has a value based on the on resistances of the plurality of switches, and wherein the value is $R+R_{ON}/\beta$, wherein R is a DAC resistance, a ratio of a DAC element to $R\beta$ determines a DAC radix, and $R_{ON}$ is the on resistance of each of the plurality of switches.

23. A method for regulating switches in an NL bit digital to analog converter, comprising:
providing NL ladder resistors connected in parallel;
connecting NL series resistors in series between the NL ladder resistors;
connecting adjacent pairs of a plurality of switches in series with respective ones of the ladder resistors, wherein NL is an integer greater than one, and wherein on resistances of each of the plurality of switches are approximately equal;
providing a plurality of switch control signals to respective ones of the plurality of switches; and
providing an NS bit segment module having a plurality of segment resistors connected in parallel and a plurality of segment switches, wherein adjacent pairs of the plurality of segment switches are connected in series with respective ones of the segment resistors, and wherein on resistances of each of the plurality of segment switches are approximately equal to the on resistances of the plurality of switches.

24. The method of claim 23 wherein each of the NL series resistors has a value based on the on resistances of the plurality of switches, and wherein the value is $R+R_{ON}/\beta$, wherein R is a DAC resistance, a ratio of a DAC element to $R\beta$ determines a DAC radix, and $R_{ON}$ is the on resistance of each of the plurality of switches.

* * * * *

UNITED STATES PATENT AND TRADEMARK OFFICE
CERTIFICATE OF CORRECTION

| | |
|---|---|
| PATENT NO. | : 8,581,766 B1 |
| APPLICATION NO. | : 13/351570 |
| DATED | : November 12, 2013 |
| INVENTOR(S) | : Yuanfang Li et al. |

It is certified that error appears in the above-identified patent and that said Letters Patent is hereby corrected as shown below:

In the Specifications:

| | |
|---|---|
| Column 1, Line 57 | Delete "13" and insert --ß-- |
| Column 4, Line 13 | After "the", delete "of a" |
| Column 4, Line 24 | Delete "$RDL_I$" and insert --$RDL_i$-- |

Signed and Sealed this
First Day of April, 2014

Michelle K. Lee
*Deputy Director of the United States Patent and Trademark Office*